(12) United States Patent
Taira et al.

(10) Patent No.: US 6,503,645 B1
(45) Date of Patent: Jan. 7, 2003

(54) DIELECTRIC CERAMIC COMPOSITION AND CERAMIC ELECTRONIC COMPONENT

(75) Inventors: Hiroaki Taira, Izumo (JP); Yasutaka Sugimoto, Kyoto (JP)

(73) Assignee: Murata Manufacturing Co. Ltd. (JP)

( * ) Notice: Subject to any disclaimer, the term of this patent is extended or adjusted under 35 U.S.C. 154(b) by 105 days.

(21) Appl. No.: 09/684,239

(22) Filed: Oct. 6, 2000

(30) Foreign Application Priority Data

Oct. 7, 1999 (JP) .......................................... 11-286383

(51) Int. Cl.[7] ................................................. B32B 9/00
(52) U.S. Cl. ........................ 428/699; 428/697; 501/32; 501/134; 501/135
(58) Field of Search ................................ 428/688, 697, 428/689, 701, 702; 501/11, 27, 32, 55, 73, 53, 63, 68, 69, 72, 134, 135

(56) References Cited

U.S. PATENT DOCUMENTS 5,493,262 A * 2/1996 Abe et al.
5,759,935 A   6/1998 Mizutani et al.
5,822,176 A * 10/1998 Sano et al.

FOREIGN PATENT DOCUMENTS

| DE | 3915169 A1 | 12/1989 |
| JP | 01286949   | * 11/1989 |
| JP | 6008209    | 2/1994 |

OTHER PUBLICATIONS

German Office Action dated Nov. 19, 2002, with full English translation.

* cited by examiner

*Primary Examiner*—Deborah Jones
*Assistant Examiner*—A B Sperty
(74) *Attorney, Agent, or Firm*—Dickstein, Shapiro, Morin & Oshinsky, LLP.

(57) ABSTRACT

A dielectric ceramic composition is comprised of a dielectric ceramic component represented by the formula: $Ba(Zr_xZn_yTa_z)_\alpha O_w$, wherein, on a molar basis, $0.01 \leq x \leq 0.06$, $0.29 \leq y \leq 0.34$, $0.60 \leq z \leq 0.70$, $x+y+z=1$, $1.00 < \alpha < 1.03$, and w is an arbitrary number, wherein a is a molar ratio of $Zr_xZn_yTa_z$ to Ba; and a glass component containing silicon oxide and boron oxide. This composition can be sintered at a low temperature, and exhibits superior electrical and temperature characteristics. A ceramic electronic component has a dielectric layer composed of this dielectric ceramic composition and a conductive layer.

14 Claims, 3 Drawing Sheets

DIELECTRIC CERAMIC COMPOSITION AND CERAMIC ELECTRONIC COMPONENT

BACKGROUND OF THE INVENTION

1. Field of the Invention

The present invention relates to dielectric ceramic compositions having enhanced dielectric constants and ceramic electronic components using the dielectric ceramic compositions as dielectric layers.

2. Description of the Related Art

In recent years, the performance of electronic components has been significantly improved. In particular, computers to support the information-intensive society and information processing units such as mobile communication terminals are moving toward higher information processing speeds and more compact and versatile devices. Improvements in information processing devices are achieved by high integration densities, high processing speeds, and the advanced capabilities of semiconductor devices such as VLSI and ULSI. Such high-speed, high-capacity semiconductor devices, however, do not always perform optimally because substrates for connecting devices generate signal delays, cross-talk, impedance mismatch, and noise due to fluctuations in the supplied voltage.

A multichip module (MCM) including a plurality of semiconductor devices on a ceramic substrate is used in practice as a substrate for performing high-speed and high-performance information processing. Among MCMs, a ceramic multi-layer substrate including a three-dimensionally arranged conductor pattern is useful for increasing the mounting density of semiconductor devices and for performing making electrical connections.

Alumina has been conventionally used as an insulating material for such a ceramic multi-layer substrate. Since alumina requires a sintering temperature as high as 1,500° C., a high-melting-point metal, such as tungsten and molybdenum, must be used as a conductive material for one-stage sintering. Sintering is generally performed in a reducing atmosphere to prevent oxidation of the high-melting-point metal. Moreover, the high-melting-point metal has a large specific resistance. Thus, high-frequency characteristics of the ceramic multi-layer substrate are limited.

In addition, alumina generally has a large specific dielectric constant of approximately 10. This may cause signal delays during high-speed operation of the semiconductor device. Since alumina has a large coefficient of thermal expansion compared to silicon, which is often used in semiconductor devices, reliability may be reduced due to thermal cycling.

In order to solve these problems, low-temperature sinterable ceramic materials which are composite materials of ceramic components and glass components are being intensively studied and ceramic multi-layer substrates using these materials are being developed. The low-temperature sinterable ceramic materials contain ceramic components as matrices and glass components as sintering auxiliaries, and have low sintering temperatures. Thus, materials having a wide variety of properties and various sintering temperatures can be employed without restriction. In particular, use of a low-temperature sinterable ceramic material facilitates one-shot sintering with a low-melting-point metal having low resistivity, such as copper, silver, or gold, and the formation of a ceramic multi-layer substrate having superior high-frequency characteristics.

In recent years, passive elements, such as capacitors and inductors, have been built into a ceramic multi-layer substrates in an attempt to further miniaturize modules. In such a case, the built-in passive elements must have characteristics, which are comparable to or better than those of surface-mounted elements, to maintain the advantages of the miniaturization of the modules.

When passive elements are mounted in a ceramic multi-layer substrate, a substrate material is generally selected so that the passive elements exhibit adequate properties. For example, a dielectric layer having a high dielectric constant is provided at a portion where a capacitor is to be formed, whereas an insulating layer having a high insulating property is provided at other portions so as to obtain a compact and high-performance ceramic multi-layer substrate.

Japanese Examined Patent Application Publication No. 6-8209, assigned to the same assignee as that of the present application, discloses a dielectric ceramic composition represented by the formula $Ba(Zr_xZn_yTa_z)_\alpha O_w$, wherein, on a molar basis, $0.01 \leq x \leq 0.06$, $0.29 \leq y \leq 0.34$, $0.60 \leq z \leq 0.70$, $x+y+z=1$, $1.00<\alpha<1.03$, and w is an arbitrary number, as a material used in a dielectric layer having a high dielectric constant. This dielectric ceramic composition is obtained by sintering at a temperature of at least 1,500° C., and exhibits significantly superior electrical characteristics, such as a high specific dielectric constant, a low resonant frequency temperature coefficient, and a Q value of at least 8,000 at approximately 7 GHz.

This dielectric ceramic composition, however, has an extremely high sintering temperature of at least 1,500° C., and thus precludes one-shot sintering with a low-melting-point metal such as silver. When a glass component is added to decrease the sintering temperature, the substrate's strength is significantly decreased in some cases, compared to alumina substrates, depending on the type and the content of the glass component, or its electrical and temperature characteristics may be significantly deteriorated even if the substrate strength remains high.

When great importance is placed on the substrate strength, the specific dielectric constant of the substrate is decreased, and capacitors having large capacitances are not easily built on the substrate. When these capacitors are built on the substrate, the electrodes of the capacitors occupy a large area on the substrate, and this is disadvantageous for miniaturization and high-density mounting of the substrate. When great importance is placed on electrical and temperature characteristics, the mechanical strength of the substrate is too low to mount semiconductor devices.

SUMMARY OF THE INVENTION

Accordingly, the present invention addresses the foregoing problems by providing a dielectric ceramic composition which can be sintered at a low temperature and which exhibits a high dielectric constant and superior electrical and temperature characteristics, and a ceramic electronic component using the dielectric ceramic composition.

The present invention relates to a dielectric ceramic composition comprising:

a dielectric ceramic component represented by the formula: $Ba(Zr_xZn_yTa_z)_\alpha O_w$, wherein, on a molar basis, $0.01 \leq x \leq 0.06$, $0.29 \leq y \leq 0.34$, $0.60 \leq z \leq 0.70$, $x+y+z=1$, $1.00<\alpha<1.03$, and w is an arbitrary number, wherein $\alpha$ is a molar ratio of $Zr_xZn_yTa_z$ to Ba; and a glass component comprising silicon oxide and boron oxide.

Preferably, the content of the glass component is 1 to 25 parts by weight with respect to 100 parts by weight of the dielectric ceramic component.

Preferably, the glass component comprises 10 to 60 percent by weight of silicon oxide, 5 to 40 percent by weight of boron oxide, 0 to 30 percent by weight of aluminum oxide, 20 to 70 percent by weight of at least one of an alkaline earth metal oxide and zinc oxide, and 0 to 15 percent by weight of alkali metal oxide.

In the present invention, 30 percent or less by mole of the Zn element in the dielectric ceramic component may be replaced with Ni.

Also 30 percent or less by mole of the Ta element in the dielectric ceramic component may be replaced with Nb.

The present invention also relates to a ceramic electronic component comprising a dielectric layer and a conductive layer, the dielectric layer comprising the above-mentioned dielectric ceramic composition.

In the ceramic electronic component, the conductive layer preferably comprises at least one conductive material selected from a copper-based material, a silver-based material, and a gold-based material.

As described above, the dielectric ceramic composition in accordance with the present invention comprises the dielectric ceramic component represented by the above formula (hereinafter referred to as "$Ba(Zr_xZn_yTa_z)_\alpha O_w$ dielectric ceramic component") and the glass component containing at least silicon oxide and boron oxide (hereinafter referred to as the "$SiO_2$—$B_2O_3$ glass component"). The dielectric ceramic composition maintains a high specific dielectric constant, a small-resonant frequency temperature coefficient, and a high Q value in a high-frequency region of the $Ba(Zr_xZn_yTa_z)_\alpha O_w$ dielectric ceramic component. Moreover, the dielectric ceramic composition having superior electrical and temperature characteristics is obtainable at a sintering temperature which is lower than melting points of low-melting-point metals.

In the ceramic electronic component having the conductive layer on the dielectric layer, the dielectric layer is formed of the dielectric ceramic composition in accordance with the present invention. Thus, the dielectric layer can be simultaneously sintered together with a low-melting-point metal material having small specific resistance. As a result, the ceramic electronic component exhibits superior electrical and temperature characteristics, and in particular, exhibits superior high-frequency characteristics.

Other features and advantages of the present invention will become apparent from the following description of the invention which refers to the accompanying drawings.

DESCRIPTION OF EMBODIMENTS OF THE INVENTION

Figure 1:
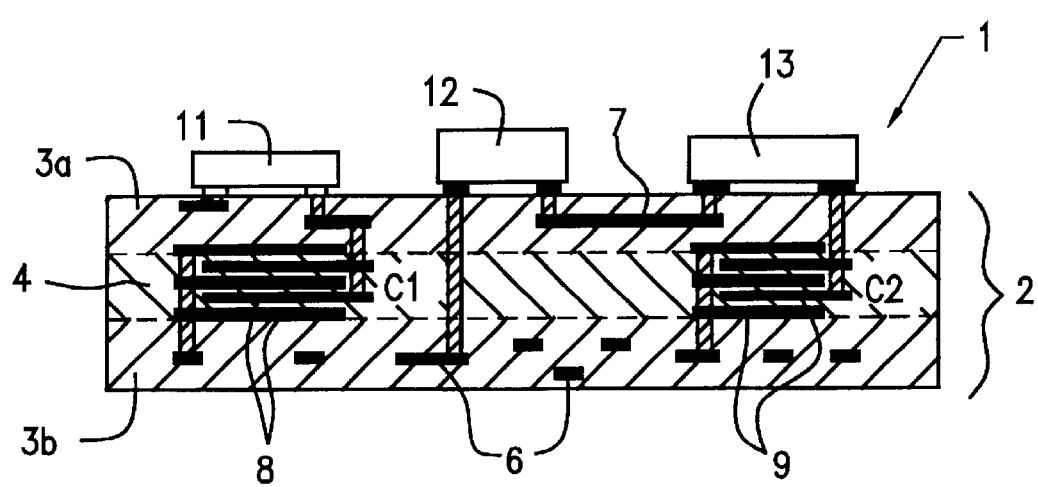
FIG. 1 is a cross-sectional view of a ceramic multi-layer substrate in accordance with a first embodiment of the present invention.

In the present invention, the dielectric ceramic component is represented by the formula: $Ba(Zr_xZn_yTa_z)_\alpha O_w$, wherein, on a molar basis, $0.01 \leq x \leq 0.06$, $0.29 \leq y \leq 0.34$, $0.60 \leq z \leq 0.70$, $x+y+z=1$, and $1.00 < \alpha < 1.03$, wherein a is a molar ratio of $Zr_xZn_yTa_z$ to Ba. This dielectric ceramic component exhibits superior electrical and temperature characteristics, that is, a high dielectric constant, a small resonant frequency temperature coefficient, and a significantly high Q value in a high-frequency region.

At $x<0.01$ on a molar basis, the dielectric ceramic component is barely sintered at a temperature of not higher than 1,100° C. even if the $SiO_2$—$B_2O_3$ glass component is added, or the resulting dielectric ceramic composition exhibits a low Q value even if the sintering is achieved at a temperature not higher than 1,100° C. At $x>0.06$, the temperature coefficient of the resonant frequency of the dielectric ceramic composition is increased.

At $y<0.29$ or at $y>0.34$ on a molar basis, the dielectric ceramic composition is barely sintered at a temperature of not higher than 1,100° C. even if the $SiO_2$—$B_2O_3$ glass component is added, or the resulting dielectric ceramic composition exhibits a significantly low Q value.

At $z<0.60$ or at $z>0.70$ on a molar basis, the dielectric ceramic composition is barely sintered at a temperature of not higher than 1,100° C. even if the $SiO_2$—$B_2O_3$ glass component is added, or the resulting dielectric ceramic composition exhibits a significantly low Q value.

At $\alpha \leq 1.00$ on a molar basis, the dielectric ceramic composition is barely sintered at a temperature of not higher than 1,100° C. even if the $SiO_2$—$B_2O_3$ glass component is added, or the resulting dielectric ceramic composition exhibits a significantly low Q value. Also at $\alpha \geq 1.03$, the dielectric ceramic composition has a low Q value.

The $SiO_2$—$B_2O_3$ glass component in the present invention primarily contributes to lowering the sintering temperature of the $Ba(Zr_xZn_yTa_z)_\alpha O_w$-based dielectric ceramic component. Silicon oxide and boron oxide in the glass component are essential for sintering at a low temperature of not higher than 1,100° C., and for superior electrical and temperature characteristics, such as a high Q value.

In the present invention, it is preferable that 1 to 25 parts by weight of the $SiO_2$—$B_2O_3$ glass component be added to 100 parts by weight of the $Ba(Zr_xZn_yTa_z)_\alpha O_w$ dielectric ceramic composition. At a glass component content of less than 1 part by weight, sintering is unsatisfactory at a temperature of not higher than 1,000° C. At a glass component content exceeding 25 parts by weight, the Q value of the dielectric ceramic composition tends to decrease.

The $SiO_2$—$B_2O_3$ glass component preferably contains 10 to 60 percent by weight of silicon oxide ($SiO_2$), 5 to 40 percent by weight of boron oxide ($B_2O_3$), 0 to 30 percent by weight of aluminum oxide ($Al_2O_3$), 20 to 70 percent by weight of alkaline earth metal oxide and/or zinc oxide, and 0 to 15 percent by weight of alkali metal oxide.

At a $SiO_2$ content of less than 10 percent by weight in the glass component, the resulting dielectric ceramic composition tends to have decreased humidity resistance and a decreased Q value. At a $SiO_2$ content exceeding 60 percent by weight, the softening temperature of the glass component increases and sintering may be inhibited at a temperature of 1,000° C. or less which facilitates one-shot sintering with an Ag-based or Cu-based material.

At a $B_2O_3$ content of less than 5 percent by weight, the softening point of the glass component is excessively increased and sintering may be inhibited. At a $B_2O_3$ content exceeding 40 percent by weight, humidity resistance of the dielectric ceramic composition tends to decrease.

$Al_2O_3$ is not an essential component in the present invention, and may be contained in an amount of 30 percent or less by weight. At an $Al_2O_3$ content exceeding 30 percent by weight, the softening point of the glass component increases and sintering may be inhibited.

At a total content of alkaline earth metal oxide, such as MgO, CaO, SrO, and BaO, and zinc oxide of less than 20 percent by weight, the softening point of the glass component is excessively increased and sintering may be inhibited. At a content exceeding 70 percent by weight, the humidity resistance and the Q value of the dielectric ceramic composition tend to decrease.

The addition of the alkali metal oxide, such as $Li_2O$, $Na_2O$ or $K_2O$, to the glass component is effective for low-temperature sintering of the $Ba(Zr_xZn_yTa_z)_\alpha O_w$ dielectric ceramic composition. At a content of the alkali metal oxide exceeding 15 percent by weight, the humidity resistance and the Q value of the dielectric ceramic composition tend to decrease.

It is preferable that 30 percent or less by mole of Zn in the $Ba(Zr_xZn_yTa_z)_\alpha O_w$ dielectric ceramic composition be replaced with Ni in order to further improve the Q value. The Q value of the dielectric ceramic composition can also be improved by replacing 30 percent or less by mole of Ta with Nb. The Q value can also be further improved by replacing 30 percent or less by mole of Zn with Ni and by replacing 30 percent or less by mole of Ta with Nb.

In particular, when 1 to 25 parts by weight of the $SiO_2$—$B_2O_3$ glass component is added to 100 parts by weight of the $Ba(Zr_xZn_yTa_z)_\alpha O_w$ dielectric ceramic component represented by the formula $Ba\{Zr_x(Zn_{1-u}Ni_u)_y(Ta_{1-v}Nb_v)_z\}_\alpha O_w$, wherein, on a molar basis, $0.01 \leq x \leq 0.06$, $0.29 \leq y \leq 0.34$, $0.60 \leq z \leq 0.70$, $x+y+z=1$, $1.00 < \alpha < 1.03$, $0 < u \leq 0.30$, $0 < v \leq 0.30$, and w is an arbitrary number, a compact of the glass-ceramic mixture can be sintered at a temperature of 900° C. to 1,100° C. Thus, the dielectric ceramic composition can be simultaneously sintered with a low-melting-point metal having low resistivity, such as silver or copper, and has superior electrical characteristics, that is, a specific dielectric constant $\in_r$ of at least 25 and a Q value of at least 1,000.

In the ceramic electronic component of the present invention, the conductive layer preferably comprises at least one low-melting-point metal material selected from a copper-based material, such as elemental copper, CuO, or $Cu_2O$; a silver-based material, such as elemental silver, Ag—Pt, Ag—Pd; and a gold-based material, such as elemental Au. These low-melting-point metal materials are available at relatively low prices, have relatively low resistivity, and exhibit superior characteristics in a high-frequency region.

In the ceramic electronic component of the present invention, the dielectric layer may be provided on an insulating layer. That is, in the ceramic electronic component of the present invention, a ceramic multi-layer substrate may comprise a dielectric layer containing capacitors and the like, provided on an insulating layer including an insulating substrate.

It is preferable that the insulating layer be composed of a ceramic composition which can be simultaneously sintered with the above-described low-melting-point metal material. For example, the insulating layer may be composed of $MgAl_2O_4$ containing glass components, such as $B_2O_3$, MgO, and $SiO_2$, or powdered alumina ceramic containing a CaO—$Al_2O_3$—$SiO_2$ glass component.

Embodiments of the ceramic electronic component of the present invention will now be described.

First Embodiment

With reference to FIG. 1, a first embodiment of the ceramic electronic component is a ceramic multi-layer module 1 including a ceramic multi-layer substrate 2, and components 11, 12, and 13, such as semiconductor devices, mounted on the ceramic multi-layer substrate 2. In the ceramic multi-layer substrate 2, a dielectric layer 4 in accordance with the dielectric ceramic composition of the present invention is disposed between an insulating layer 3a and another insulating layer 3b. The dielectric layer 4 having a high dielectric constant includes internal electrodes 8 and 9 therein which form capacitors $C_1$ and $C_2$. The insulating layers 3a and 3b include internal leads 6 and 7 for electrically connecting capacitors $C_1$ and $C_2$ and external terminals.

An example of a method for making the ceramic multi-layer substrate 2 will now be described.

As materials for the insulating layers 3a and 3b, for example, powdered alumina ceramic and powdered glass primarily composed of CaO—$Al_2O_3$—$SiO_2$ are prepared, and 20 to 30 parts by weight of the powdered glass is compounded with 100 parts by weight of the powdered alumina ceramic. An organic binder, a dispersant, a plasticizer, and an organic solvent are added to the mixture in appropriate amounts to prepare a slurry for the insulating layers. The slurry is applied by a doctor blade process to form a ceramic green sheet for the insulating layers.

As a material for the dielectric layer 4, powdered $Ba(Zr_xZn_yTa_z)_\alpha O_w$ dielectric ceramic is prepared and calcined at 1,000° C. for at least 1 hour. The calcined material is pulverized, and a $SiO_2$—$B_2O_3$ glass component is compounded to the pulverized material to prepare a glass-ceramic mixture. An organic vehicle, a dispersant, a plasticizer, and an organic solvent are added to the mixture in appropriate amounts to form a slurry for the dielectric layer. The slurry for the dielectric layer is applied by a doctor blade process to form a ceramic green sheet for the dielectric layer.

Holes are provided in the ceramic green sheets for the insulating layer and the ceramic green sheet for the dielectric layer, if necessary, and are filled with conductive paste or conductive powder to form vias (via holes). A conductive paste is printed onto the ceramic green sheet for the dielectric layer to form capacitors $C_1$ and $C_2$. Also conductive patterns, if necessary, are formed on the ceramic green sheets for the insulating layers, and the ceramic green sheets for the dielectric layer and the insulating layers are laminated.

The laminated ceramic green sheets are pressed to form a laminate block. If necessary, the block may be cut up into appropriate size pieces, or grooves may be formed on the block. The block is sintered at a temperature of not higher than 1,000° C. to form the ceramic multi-layer substrate 2 including the capacitors $C_1$ and $C_2$ as shown in FIG. 1.

Alternatively, the dielectric layer 4 may be formed by printing a dielectric paste on portions where electrodes are to be formed. In this case, the dielectric paste is prepared by mixing a powdered glass-ceramic mixture containing a $Ba(Zr_xZn_yTa_z)_\alpha O_w$ dielectric ceramic component and a $SiO_2$—$B_2O_3$ glass component, an organic vehicle, an organic solvent, and a plasticizer. In such a case, after the dielectric layer is formed, a ceramic multi-layer substrate is prepared via lamination, compression, cutting and sintering of the green sheets.

Since the ceramic multi-layer substrate 2 in accordance with the first embodiment includes capacitors therein, the substrate is of reduced dimensions. Moreover, the dielectric layer 4 having a high dielectric constant is provided between the capacitor electrodes. Thus, a relatively small electrode pattern can form capacitors having large capacitances.

Since the dielectric layer 4 is formed of a dielectric ceramic composition of the present invention, the ceramic multi-layer substrate 2 exhibits superior electrical and temperature characteristics due to a satisfactory resonant frequency temperature coefficient, a high specific dielectric constant, and a high Q value of the dielectric ceramic component.

Preferably, the insulating layers 3a and 3b contain a glass component which is substantially the same as the $SiO_2$—$B_2O_3$ glass component for the dielectric layer 4 to improve adhesion between the insulating layers 3a and 3b and the dielectric layer 4.

Second Embodiment

Figure 2:
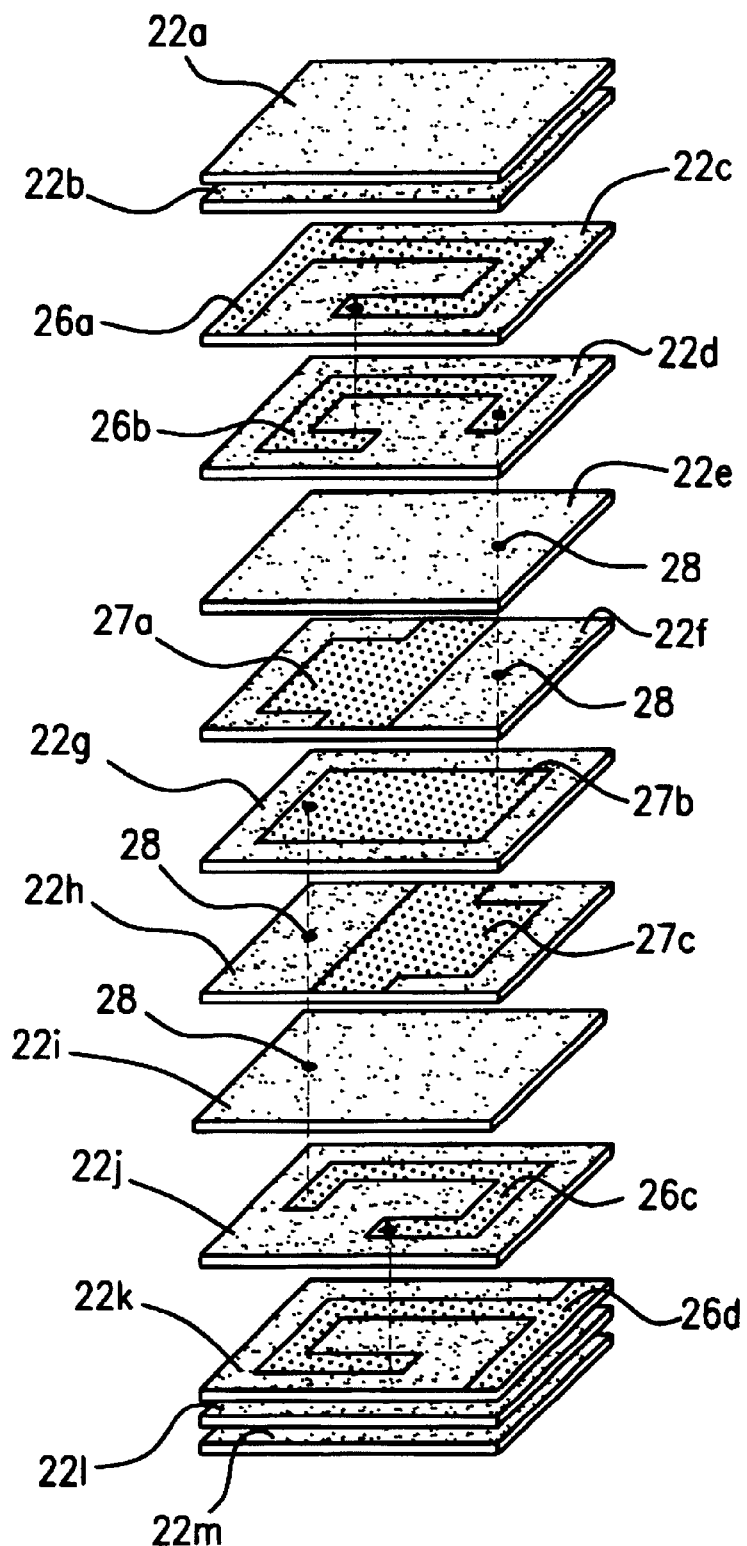
FIG. 2 is an exploded perspective view of an LC filter in accordance with a second embodiment of the present invention.
Figure 3:
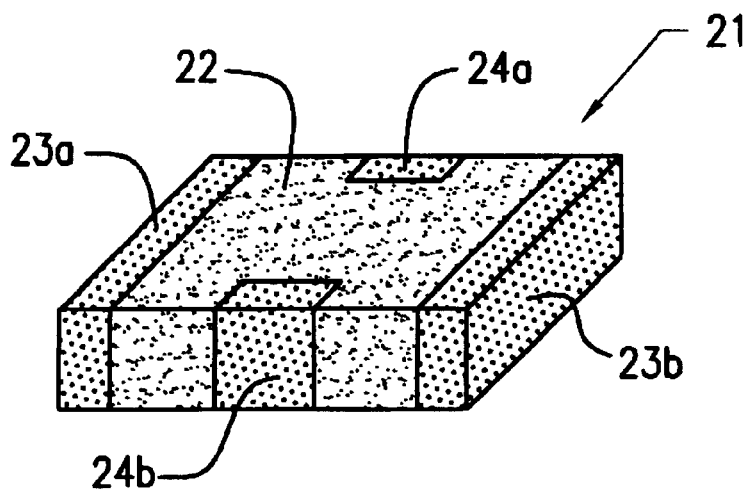
FIG. 3 is a perspective view of the LC filter in accordance with the second embodiment.
Figure 4:
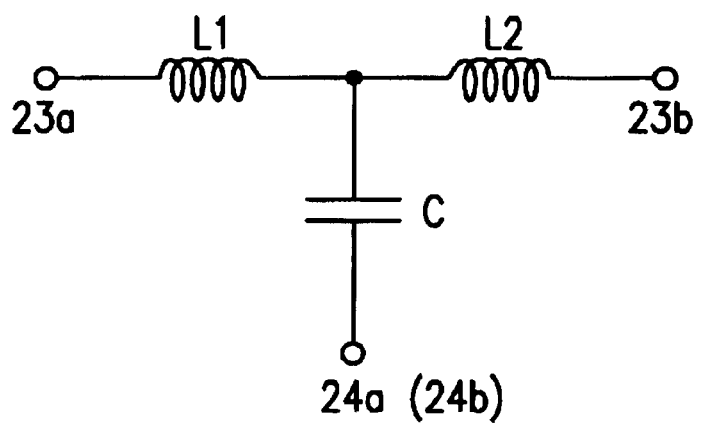
FIG. 4 is an equivalent circuit diagram of the LC filter in accordance with the second embodiment.

With reference to FIGS. 2 to 4, a ceramic electronic component in accordance with a second embodiment is an LC filter 21 having a dielectric layer 22 which includes coil patterns 26a, 26b, 26c, and 26d, and capacitor patterns 27a, 27b, and 27c.

The LC filter 21 maybe prepared as follows. A $Ba(Zr_xZn_yTa_z)_\alpha O_w$ dielectric ceramic component and a $SiO_2$—$B_2O_3$ glass component are compounded to prepare a powdered glass-ceramic mixture, and an organic vehicle is added to the mixture to prepare a slurry. Using the slurry, a ceramic green sheet having a thickness of, for example, 40 $\mu$m is prepared by a casting method or the like. The ceramic green sheet is punched out into predetermined dimensions to form ceramic green sheets 22a to 22m for dielectric layers.

As shown in FIG. 2, via holes 28 are formed, if necessary, through the ceramic green sheets 22a to 22m for the dielectric layers. Using conductive paste, patterns 26a to 26b for coil $L_1$, patterns 27a to 27c for capacitor C, and patterns 26c and 26d for coil $L_2$ are screen-printed onto the ceramic green sheets 22a to 22m for the dielectric layers. The ceramic green sheets 22a to 22m are laminated and compressed to form a laminate block 22 shown in FIG. 3.

The laminate block is sintered at a temperature of 1,000° C. or less for 2 hours to form the dielectric layer 22. As shown in FIG. 3, external electrodes 23a, 23b, 24a, and 24b are formed on two sides of the resulting dielectric layer 22 to prepare the LC filter 21 including the capacitor C and the coils $L_1$ and $L_2$. The LC filter 21 has the equivalent circuit shown in FIG. 4.

In the LC filter 21 in accordance with the second embodiment, the dielectric layer 22 of the dielectric block is formed of the dielectric ceramic composition, and has a small resonant frequency temperature coefficient, a high specific dielectric constant, and a high Q value. Thus, the LC filter exhibits superior electrical and temperature characteristics. By forming, the capacitor pattern and the coil pattern using a low-melting points metal, the LC filter exhibits superior high-frequency characteristics.

The present invention has been described with reference to the ceramic multi-layer module and the LC filter, but is not limited to the above embodiments.

For example, the ceramic electronic component of the present invention may be a ceramic multi-layer substrate, such as a multi-chip module substrate or a hybrid IC substrate; a ceramic electronic component including a ceramic multi-module having surface-mounted components; or a chip ceramic electronic component, such as a monolithic chip capacitor or a chip antenna.

EXAMPLES

The present invention will now be described in more detail with reference to the following Examples.

As starting, materials of a glass component, $BaCO_3$, $SrCO_3$, $CaCO_3$, $MgCO_3$, ZnO, $Al_2O_3$, $Li_2CO_3$, $Na_2CO_3$, $K_2CO_3$, $SiO_2$, and $B_2O_3$ were prepared and were compounded based on the formulations shown in Tables 1 and 2. Each mixture was melted in a Pt—Rh crucible at 1,400° C. to 1,600° C. was quenched, and was pulverized. Powdered glass samples G1 to G35 were thereby prepared.

TABLE 1

| Glass | $SiO_2$ | $B_2O_3$ | $Al_2O_3$ | Alkali Metal Oxides | | | | Alkaline Earth Metal Oxides | | | | |
| | | | | $K_2O$ | $Li_2O$ | $Na_2O$ | PbO | BaO | SrO | CaO | MgO | ZnO |
|---|---|---|---|---|---|---|---|---|---|---|---|---|
| G1  | 32 | 37 | —  | 3  | —  | —  | —  | —  | —  | 28 | —  | —  |
| G2  | 55 | —  | 5  | 2  | —  | —  | —  | —  | —  | 38 | —  | —  |
| G3  | 48 | —  | 10 | —  | 2  | —  | —  | —  | —  | 40 | —  | —  |
| G4  | 25 | 20 | —  | —  | 10 | —  | —  | —  | —  | 45 | —  | —  |
| G5  | —  | 40 | 20 | 20 | —  | —  | 20 | —  | —  | —  | —  | —  |
| G6  | 5  | 30 | —  | —  | 2  | —  | —  | —  | —  | 63 | —  | —  |
| G7  | 10 | 25 | —  | —  | 4  | —  | —  | 61 | —  | —  | —  | —  |
| G8  | 60 | 10 | —  | —  | 10 | —  | —  | 20 | —  | —  | —  | —  |
| G9  | 70 | 10 | —  | —  | 15 | —  | —  | 5  | —  | —  | —  | —  |
| G10 | 35 | 2  | —  | —  | 15 | —  | —  | —  | 48 | —  | —  | —  |
| G11 | 32 | 5  | —  | —  | 15 | —  | —  | —  | 48 | —  | —  | —  |
| G12 | 15 | 40 | —  | —  | 5  | —  | —  | —  | —  | —  | 40 | —  |
| G13 | 10 | 50 | —  | —  | 5  | —  | —  | —  | —  | —  | 35 | —  |
| G14 | 20 | 20 | 10 | —  | 10 | —  | —  | —  | —  | 40 | —  | —  |
| G15 | 15 | 15 | 30 | —  | 10 | —  | —  | 30 | —  | —  | —  | —  |
| G16 | 15 | 10 | 40 | —  | 5  | —  | —  | 30 | —  | —  | —  | —  |
| G17 | 20 | 20 | —  | —  | 20 | —  | —  | —  | —  | 40 | —  | —  |
| G18 | 25 | 20 | —  | —  | —  | 10 | —  | —  | —  | —  | —  | 45 |
| G19 | 20 | 20 | —  | —  | —  | 20 | —  | —  | —  | —  | —  | 40 |
| G20 | 27 | 22 | —  | —  | 3  | 3  | —  | —  | —  | 45 | —  | —  |

TABLE 2

| Glass | SiO$_2$ | B$_2$O$_3$ | Al$_2$O$_3$ | Alkali Metal Oxides | | | | Alkaline Earth Metal Oxides | | | | |
|---|---|---|---|---|---|---|---|---|---|---|---|---|
| | | | | K$_2$O | Li$_2$O | Na$_2$O | PbO | BaO | SrO | CaO | MgO | ZnO |
| G21 | 40 | 35 | — | — | 10 | — | — | — | — | 15 | — | — |
| G22 | 40 | 30 | — | — | 10 | — | — | — | — | 20 | — | — |
| G23 | 10 | 10 | — | — | 5 | — | — | — | — | 70 | — | — |
| G24 | 10 | 10 | — | — | — | — | — | — | — | 80 | — | — |
| G25 | 15 | 10 | — | — | 6 | — | — | 70 | — | — | — | — |
| G26 | 10 | 10 | — | — | — | — | — | 80 | — | — | — | — |
| G27 | 40 | 40 | — | — | 10 | — | — | — | 10 | — | — | — |
| G28 | 35 | 35 | — | — | 10 | — | — | — | 20 | — | — | — |
| G29 | 40 | 40 | — | — | 10 | — | — | — | — | — | 10 | — |
| G30 | 35 | 35 | — | — | 10 | — | — | — | — | — | 20 | — |
| G31 | 15 | 10 | — | — | 5 | — | — | — | — | — | — | 70 |
| G32 | 10 | 10 | — | — | — | — | — | — | — | — | — | 80 |
| G33 | 27 | 12 | — | — | 5 | — | — | — | — | 25 | — | 20 |
| G34 | 40 | 40 | — | — | 10 | — | — | — | — | 5 | — | 5 |
| G35 | 35 | 35 | — | — | 10 | — | — | — | — | 10 | — | 10 |

As starting materials for dielectric ceramic components, BaCO$_3$, ZrO$_2$, ZnO, Ta$_2$O$_5$, NiO, and Nb$_2$O$_5$ were prepared and were compounded according to the formulations shown in Tables 3 to 5. Each compound was mixed by a wet process in a ball mill for 16 hours, was dehydrated, was dried, and was heated at 1,000° C. for 2 hours to prepare a mixture for a dielectric ceramic component.

One of powdered glass samples G1 to G35 was added to 100 parts by weight of each mixture for the dielectric ceramic component based on the formulations shown in Tables 3 to 5. An organic binder and a plasticizer were added to each glass-ceramic mixture, and the glass-ceramic mixture was pulverized by a wet process in a ball mill for 16 hours to prepare a slurry for a dielectric ceramic composition.

The slurry was molded by compression molding under a pressure of 2,000 kgf/cm$^2$ to form a green disk which had a diameter of 10 mm and a thickness of 5 mm after sintering. The green disk was sintered at 900° C. to 1,200° C. for 2 hours. Dielectric ceramic compositions 1 to 63 shown in Tables 3 to 5 were thereby prepared.

TABLE 3

| Compo- | Dielectric Ceramic Component | | | | | | Glass Component | |
|---|---|---|---|---|---|---|---|---|
| | (Molar Ratio) | | | | | | Type of | Content |
| sition | x | y | z | u | v | α | Glass | (wt %) |
| 1 | 0.00 | 0.32 | 0.68 | 0 | 0 | 1.01 | G1 | 20 |
| 2 | 0.00 | 0.32 | 0.68 | 0 | 0 | 1.01 | G1 | 10 |
| 3 | 0.01 | 0.29 | 0.70 | 0 | 0 | 1.02 | G1 | 10 |
| 4 | 0.02 | 0.30 | 0.68 | 0 | 0 | 1.02 | G1 | 20 |
| 5 | 0.04 | 0.28 | 0.68 | 0 | 0 | 1.01 | G1 | 25 |
| 6 | 0.04 | 0.28 | 0.68 | 0 | 0 | 1.01 | G1 | 20 |
| 7 | 0.01 | 0.33 | 0.66 | 0 | 0 | 1.01 | G4 | 5 |
| 8 | 0.03 | 0.31 | 0.66 | 0 | 0 | 1.03 | G4 | 5 |
| 9 | 0.03 | 0.31 | 0.66 | 0 | 0 | 1.02 | G4 | 5 |
| 10 | 0.03 | 0.31 | 0.66 | 0 | 0 | 1.00 | G4 | 10 |
| 11 | 0.05 | 0.29 | 0.66 | 0 | 0 | 1.02 | G4 | 25 |
| 12 | 0.02 | 0.34 | 0.64 | 0 | 0 | 1.01 | G4 | 5 |
| 13 | 0.02 | 0.34 | 0.64 | 0 | 0 | 1.01 | G2 | 25 |
| 14 | 0.02 | 0.34 | 0.64 | 0 | 0 | 1.01 | G2 | 40 |
| 15 | 0.02 | 0.34 | 0.64 | 0 | 0 | 1.01 | G3 | 25 |
| 16 | 0.02 | 0.34 | 0.64 | 0 | 0 | 1.01 | G3 | 40 |
| 17 | 0.02 | 0.34 | 0.64 | 0 | 0 | 1.01 | G5 | 25 |
| 18 | 0.02 | 0.34 | 0.64 | 0 | 0 | 1.01 | G5 | 1 |

TABLE 3-continued

| Compo- | Dielectric Ceramic Component | | | | | | Glass Component | |
|---|---|---|---|---|---|---|---|---|
| | (Molar Ratio) | | | | | | Type of | Content |
| sition | x | y | z | u | v | α | Glass | (wt %) |
| 19 | 0.04 | 0.32 | 0.64 | 0 | 0 | 1.02 | G1 | 0.05 |
| 20 | 0.04 | 0.32 | 0.64 | 0 | 0 | 1.02 | G1 | 1 |
| 21 | 0.04 | 0.32 | 0.64 | 0 | 0 | 1.02 | G1 | 10 |
| 22 | 0.04 | 0.32 | 0.64 | 0 | 0 | 1.02 | G1 | 25 |
| 23 | 0.04 | 0.32 | 0.64 | 0 | 0 | 1.02 | G1 | 35 |
| 24 | 0.04 | 0.32 | 0.64 | 0.1 | 0 | 1.02 | G1 | 10 |
| 25 | 0.04 | 0.32 | 0.64 | 0.2 | 0 | 1.02 | G1 | 10 |

TABLE 4

| Compo- | Dielectric Ceramic Component | | | | | | Glass Component | |
|---|---|---|---|---|---|---|---|---|
| | (Molar Ratio) | | | | | | Type of | Content |
| sition | x | y | z | u | v | a | Glass | (wt %) |
| 26 | 0.04 | 0.32 | 0.64 | 0.3 | 0 | 1.02 | G1 | 10 |
| 27 | 0.04 | 0.32 | 0.64 | 0.4 | 0 | 1.02 | G1 | 10 |
| 28 | 0.04 | 0.32 | 0.64 | 0.0 | 0.2 | 1.02 | G1 | 10 |
| 29 | 0.04 | 0.32 | 0.64 | 0.0 | 0.4 | 1.02 | G1 | 10 |
| 30 | 0.04 | 0.32 | 0.64 | 0.4 | 0.4 | 1.02 | G1 | 10 |
| 31 | 0.07 | 0.29 | 0.64 | 0 | 0 | 1.01 | G4 | 5 |
| 32 | 0.03 | 0.35 | 0.62 | 0 | 0 | 1.01 | G4 | 25 |
| 33 | 0.05 | 0.33 | 0.62 | 0 | 0 | 1.03 | G1 | 10 |
| 34 | 0.06 | 0.34 | 0.60 | 0.2 | 0 | 1.02 | G1 | 20 |
| 35 | 0.02 | 0.34 | 0.64 | 0 | 0 | 1.01 | G6 | 5 |
| 36 | 0.02 | 0.34 | 0.64 | 0 | 0 | 1.01 | G7 | 5 |
| 37 | 0.02 | 0.34 | 0.64 | 0 | 0 | 1.01 | G8 | 5 |
| 38 | 0.02 | 0.34 | 0.64 | 0 | 0 | 1.01 | G9 | 5 |
| 39 | 0.02 | 0.34 | 0.64 | 0 | 0 | 1.01 | G10 | 5 |
| 40 | 0.02 | 0.34 | 0.64 | 0 | 0 | 1.01 | G11 | 5 |
| 41 | 0.02 | 0.34 | 0.64 | 0 | 0 | 1.01 | G12 | 5 |
| 42 | 0.02 | 0.34 | 0.64 | 0 | 0 | 1.01 | G13 | 5 |
| 43 | 0.02 | 0.34 | 0.64 | 0 | 0 | 1.01 | G14 | 5 |
| 44 | 0.02 | 0.34 | 0.04 | 0 | 0 | 1.01 | G15 | 5 |
| 45 | 0.02 | 0.34 | 0.64 | 0 | 0 | 1.01 | G16 | 5 |
| 46 | 0.02 | 0.34 | 0.64 | 0 | 0 | 1.01 | G17 | 5 |
| 47 | 0.02 | 0.34 | 0.64 | 0 | 0 | 1.01 | G18 | 5 |
| 48 | 0.02 | 0.34 | 0.64 | 0 | 0 | 1.01 | G19 | 5 |

TABLE 4-continued

| Compo-sition | Dielectric Ceramic Component (Molar Ratio) | | | | | | Glass Component | |
|---|---|---|---|---|---|---|---|---|
| | x | y | z | u | v | a | Type of Glass | Content (wt %) |
| 49 | 0.02 | 0.34 | 0.64 | 0 | 0 | 1.01 | G20 | 5 |
| 50 | 0.02 | 0.34 | 0.64 | 0 | 0 | 1.01 | G21 | 5 |

TABLE 5

| Compo-sition | Dielectric Ceramic Component (Molar Ratio) | | | | | | Glass Component | |
|---|---|---|---|---|---|---|---|---|
| | x | y | z | u | v | a | Type of Glass | Content (wt %) |
| 51 | 0.02 | 0.34 | 0.64 | 0 | 0 | 1.01 | G22 | 5 |
| 52 | 0.02 | 0.34 | 0.64 | 0 | 0 | 1.01 | G23 | 5 |
| 53 | 0.02 | 0.34 | 0.64 | 0 | 0 | 1.01 | G24 | 5 |
| 54 | 0.02 | 0.34 | 0.64 | 0 | 0 | 1.01 | G25 | 5 |
| 55 | 0.02 | 0.34 | 0.64 | 0 | 0 | 1.01 | G26 | 5 |
| 56 | 0.02 | 0.34 | 0.64 | 0 | 0 | 1.01 | G27 | 5 |
| 57 | 0.02 | 0.34 | 0.64 | 0 | 0 | 1.01 | G28 | 5 |
| 58 | 0.02 | 0.34 | 0.64 | 0 | 0 | 1.01 | G29 | 5 |
| 59 | 0.02 | 0.34 | 0.64 | 0 | 0 | 1.01 | G30 | 5 |
| 60 | 0.02 | 0.34 | 0.64 | 0 | 0 | 1.01 | G31 | 5 |
| 61 | 0.02 | 0.34 | 0.64 | 0 | 0 | 1.01 | G33 | 5 |
| 62 | 0.02 | 0.34 | 0.64 | 0 | 0 | 1.01 | G34 | 5 |
| 63 | 0.02 | 0.34 | 0.64 | 0 | 0 | 1.01 | G35 | 5 |

The specific dielectric constant ($\epsilon_r$) at a resonant frequency (approximately 7 GHz) and the Q value of each dielectric ceramic composition were measured by a dielectric resonator method (short-circuited at both ends of a dielectric resonator), i.e., a Hakki & Coleman method. These results and the sintering temperatures are shown in Tables 6 to 3.

TABLE 6

| Composition | Sintering Temperature (° C.) | Specific Dielectric Constant | Q Value | Remarks |
|---|---|---|---|---|
| 1 | 1,100 | 25 | 300 | Low Q value |
| 2 | 1,100 | — | — | Not sintered |
| 3 | 1,000 | 27 | 1,200 | |
| 4 | 900 | 26 | 1,800 | |
| 5 | 1,100 | 24 | 200 | Low Q value |
| 6 | 1,100 | — | — | Not sintered |
| 7 | 1,000 | 28 | 1,600 | |
| 8 | 1,000 | 28 | 800 | Low Q value |
| 9 | 1,000 | 28 | 1,500 | |
| 10 | 1,100 | — | — | Not sintered |
| 11 | 900 | 25 | 1,300 | |
| 12 | 1,000 | 28 | 1,600 | |
| 13 | 1,100 | — | — | Not sintered |
| 14 | 1,100 | 20 | 100 | Low Q value |
| 15 | 1,100 | — | — | Not sintered |
| 16 | 1,100 | 20 | 100 | Low Q value |
| 17 | 1,100 | 25 | 1,200 | |
| 18 | 1,100 | 30 | 800 | |
| 19 | 1,100 | 25 | 1,200 | |
| 20 | 1,100 | 30 | 2,300 | |
| 21 | 1,000 | 26 | 1,800 | |
| 22 | 900 | 25 | 1,500 | |
| 23 | 900 | 21 | 100 | |

TABLE 6-continued

| Composition | Sintering Temperature (° C.) | Specific Dielectric Constant | Q Value | Remarks |
|---|---|---|---|---|
| 24 | 1,000 | 26 | 2,000 | |
| 25 | 1,000 | 26 | 2,800 | |

TABLE 7

| Composition | Sintering Temperature (° C.) | Specific Dielectric Constant | Q Value | Remarks |
|---|---|---|---|---|
| 26 | 1,000 | 25 | 1,800 | |
| 27 | 1,000 | 23 | 900 | |
| 28 | 1,000 | 26 | 2,500 | |
| 29 | 1,000 | 25 | 800 | |
| 30 | 1,000 | 23 | 700 | |
| 31 | 1,000 | 22 | — | 0 |
| 32 | 1,100 | — | — | Not sintered |
| 33 | 1,000 | 26 | 600 | Low Q value |
| 34 | 900 | 24 | 1,100 | |
| 35 | 1,000 | 30 | 800 | |
| 36 | 1,000 | 29 | 1,100 | |
| 37 | 1,000 | 25 | 1,200 | |
| 38 | 1,100 | 25 | 1,100 | |
| 39 | 1,100 | 27 | 1,200 | |
| 40 | 1,000 | 26 | 1,000 | |
| 41 | 1,000 | 29 | 1,300 | |
| 42 | 1,000 | 29 | 1,000 | |
| 43 | 1,000 | 28 | 1,500 | |
| 44 | 1,000 | 27 | 1,200 | |
| 45 | 1,100 | 27 | 1,300 | |
| 46 | 1,000 | 31 | 800 | |
| 47 | 1,000 | 27 | 1,500 | |
| 48 | 1,000 | 30 | 700 | |
| 49 | 1,000 | 28 | 1,700 | |
| 50 | 1,000 | 27 | 1,700 | |

*1: Q value = 1,300, but tf > 30 ppm/° C.

TABLE 8

| Composition | Sintering Temperature (° C.) | Specific Dielectric Constant | Q Value | Remarks |
|---|---|---|---|---|
| 51 | 1,000 | 26 | 1,500 | |
| 52 | 1,000 | 29 | 1,000 | |
| 53 | 1,000 | 30 | 1,000 | |
| 54 | 1,000 | 31 | 800 | |
| 55 | 1,000 | 32 | 500 | |
| 56 | 1,100 | 26 | 1,900 | |
| 57 | 1,000 | 26 | 1,400 | |
| 58 | 1,100 | 25 | 2,100 | |
| 59 | 1,000 | 25 | 1,500 | |
| 60 | 1,000 | 30 | 1,100 | |
| 61 | 1,000 | 29 | 1,800 | |
| 62 | 1,100 | 26 | 2,000 | |
| 63 | 1,000 | 25 | 1,400 | |

In the dielectric ceramic compositions 3, 4, 7, 9, 11 to 12, 17 to 30, and 34 to 63, the $Ba(Zr_xZn_yTa_z)_aO_w$ dielectric ceramic components satisfy the relationships, on a molar basis, $0.01 \leq x \leq 0.06$, $0.29 \leq y \leq 0.34$, $0.60 \leq z \leq 0.70$, $x+y+z=1$, and $1.00 < \alpha < 1.03$, and $SiO_2$—$B_2O_3$ glass components are added to the dielectric ceramic components. These dielectric ceramic compositions can be sintered at a low temperature of 1,100° C. or less, and exhibit high specific dielectric constants and Q values at a high-frequency region.

Among them, in the composition 23, the content of the $SiO_2$—$B_2O_3$ glass component is 25 parts by weight with respect to 100 parts by weight of the $Ba(Zr_xZn_yTa_z)_aO_w$ dielectric ceramic component. Such a high glass content causes a decreased specific dielectric constant and a decreased Q value. In the compositions 17 and 19, the content of the $SiO_2$—$B_2O_3$ glass component is less than 1 part by weight, and thus it is difficult to obtain dense sintered compositions by sintering at 1,100° C. or less.

Since the compositions 19 to 23 exhibit high specific dielectric constants and high Q values, the content of the $SiO_2$—$B_2O_3$ glass component is preferably in a range of 1 to 25 parts by weight with respect to 100 parts by weight of the $Ba(Zr_xZn_yTa_z)_\alpha O_w$ dielectric ceramic component.

The dielectric ceramic compositions 13 to 16 not containing $SiO_2$ or $B_2O_3$ in the glass component cannot be sintered at a low temperature of not higher than 1,100° C. or exhibit significantly low Q values.

In the $SiO_2$—$B_2O_3$ glass components, the dielectric ceramic composition 35 containing less than 10 percent by weight of $SiO_2$ exhibits slightly low humidity resistance and tends to have a low Q value. On the other hand, the dielectric ceramic composition 38 having a $SiO_2$ content exceeding 60 percent by weight causes an increased sintering temperature.

In the $SiO_2$—$B_2O_3$ glass components, the dielectric ceramic composition 39 containing less than 5 percent by weight of $B_2O_3$ exhibits an increase in sintering temperature and a decrease in ease of sintering. On the other hand, the dielectric ceramic composition 38 having a $B_2O_3$ content exceeding 40 percent by weight causes a slightly low humidity resistance.

The $SiO_2$—$B_2O_3$ glass component may not contain $Al_2O_3$, as shown, for example, in the dielectric ceramic composition 36. The dielectric ceramic composition 45 having an $Al_2O_3$ content exceeding 30 percent by weight exhibits a slightly decreased sintering ability.

In the dielectric ceramic compositions 50, 56, 58, and 62 having total amounts of the alkaline earth metal oxides (MgO, CaO, SrO, and BaO) and zinc oxide (ZnO) of less than 20 percent by weight in the $SiO_2$—$B_2O_3$ glass components, the sintering temperature tends to increase. On the other hand, in the dielectric ceramic compositions 53 and 55 having total amounts exceeding 70 percent by weight, humidity resistance slightly decreases and the Q value tends to decrease.

In the dielectric ceramic compositions 46 and 48 having an alkali metal oxide ($Li_2O$, $Na_2O$, and $K_2O$) content exceeding 15 percent by weight in the $SiO_2$—$B_2O_3$ glass component, humidity resistance slightly decreases and the Q value tends to decrease.

The dielectric ceramic compositions 1 and 2 in which the Zr content x of the $Ba(Zr_xZn_yTa_z)_\alpha O_w$ dielectric ceramic components is less than 0.01 by molar ratio cannot be sintered at a temperature of not higher than 1,100° C. or exhibits low Q values even if sintering at this temperature is satisfactory. On the other hand, the dielectric ceramic composition 31 in which x>0.06 has a temperature coefficient tf of resonant frequency of 30 ppm/° C. or more, although the composition exhibits a high Q value.

The dielectric ceramic compositions 5, 6, and 32 wherein y<0.29 or y>0.34 on a molar basis in the $Ba(Zr_xZn_yTa_z)_\alpha O_w$ dielectric ceramic components cannot be sintered at a temperature of not higher than 1,100° C. or exhibit significantly low Q values.

The dielectric ceramic composition 10 wherein $\alpha \leq 1.00$ on a molar basis in the $Ba(Zr_xZn_yTa_z)_\alpha O_w$ dielectric ceramic component cannot be sintered at a temperature of not higher than 1,100° C. On the other hand, the dielectric ceramic compositions 8 and 33 wherein $\alpha \geq 1.03$ exhibit low Q values.

The dielectric ceramic composition 27 wherein more than 30 percent by mole of Zn is replaced with Ni in the $Ba(Zr_xZn_yTa_z)_\alpha O_w$ dielectric ceramic component exhibits a slightly low Q value. The dielectric ceramic composition 29 wherein more than 30 percent by mole of Ta is replaced with Nb in the $Ba(Zr_xZn_yTa_z)_\alpha O_w$ dielectric ceramic component exhibits a slightly low Q value. The dielectric ceramic composition 30 wherein more than 30 percent by mole of Ta is replaced with Nb and more than 30 percent by mole of Ta is replaced with Nb in the $Ba(Zr_xZn_yTa_z)_\alpha O_w$ dielectric ceramic component exhibits a low Q value and a decreased specific dielectric constant.

Although the present invention has been described in relation to particular embodiments thereof, many other variations and modifications and other uses will become apparent to those skilled in the art. Therefore, the present invention is not limited by the specific disclosure herein.

What is claimed is:

1. A dielectric ceramic composition comprising:
   a dielectric ceramic component represented by the formula: $Ba(Zr_xZn_yTa_z)_\alpha O_w$, wherein, on a molar basis, $0.01 \leq x \leq 0.06$, $0.29 \leq y \leq 0.34$, $0.60 \leq z \leq 0.70$, $x+y+z=1$, $1.00 < \alpha < 1.03$, and w is an arbitrary number, wherein $\alpha$ is a molar ratio of $Zr_xZn_yTa_z$ to Ba; and
   a glass component comprising 10 to 60 percent by weight of silicon oxide, 5 to 40 percent by weight of boron oxide, 0 to 30 percent by weight of aluminum oxide, 20 to 70 percent by weight of at least one of an alkaline earth metal oxide and zinc oxide, and 0 to 15 percent by weight of alkali metal oxide.

2. A dielectric ceramic composition according to claim 1, wherein the content of the glass component is 1 to 25 parts by weight with respect to 100 parts by weight of the dielectric ceramic component.

3. A dielectric ceramic composition according to claim 2, wherein the glass component comprises 10 to 60 percent by weight of silicon oxide, 5 to 40 percent by weight of boron oxide, 0 to 30 percent by weight of aluminum oxide, 20 to 70 percent by weight of at least one of an alkaline earth metal oxide and zinc oxide, and 0 to 15 percent by weight of alkali metal oxide.

4. A dielectric ceramic composition according to any one of claims 1 to 3, wherein the Zn element in the dielectric ceramic component contains 30 percent or less by mole of Ni.

5. A dielectric ceramic composition according to claim 4, wherein the Ta element in the dielectric ceramic component contains 30 percent or less by mole of Nb.

6. A dielectric ceramic composition according to any one of claims 1 to 3, wherein the Ta element in the dielectric ceramic component contains 30 percent or less by mole of Nb.

7. A ceramic electronic component comprising a dielectric layer and a conductive layer, the dielectric layer comprising a dielectric ceramic composition according to any one of claims 1 to 3.

8. A ceramic electronic component according to claim 7, wherein the conductive layer comprises at least one conductive material selected from the group consisting of a copper-based material, a silver-based material, and a gold-based material.

9. A ceramic electronic component comprising a dielectric layer and a conductive layer, the dielectric layer comprising a dielectric ceramic composition according to claim 4.

10. A ceramic electronic component according to claim 9, wherein the conductive layer comprises at least one conductive material selected from the group consisting of a copper-based material, a silver-based material, and a gold-based material.

11. A ceramic electronic component comprising a dielectric layer and a conductive layer, the dielectric layer comprising a dielectric ceramic composition according to claim 5.

12. A ceramic electronic component according to claim 11, wherein the conductive layer comprises at least one conductive material selected from the group consisting of a copper-based material, a silver-based material, and a gold-based material.

13. A ceramic electronic component comprising a dielectric layer and a conductive layer, the dielectric layer comprising a dielectric ceramic composition according to claim 6.

14. A ceramic electronic component according to claim 13, wherein the conductive layer comprises at least one conductive material selected from the group consisting of a copper-based material, a silver-based material, and a gold-based material.

* * * * *